(12) United States Patent
Kulla

(10) Patent No.: US 11,125,837 B2
(45) Date of Patent: Sep. 21, 2021

(54) MAGNETIC FIELD SENSOR OFFSET AND GAIN ADJUSTMENT

(71) Applicant: Allegro MicroSystems, LLC, Manchester, NH (US)

(72) Inventor: Florian Kulla, Annecy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 2 days.

(21) Appl. No.: 16/742,314

(22) Filed: Jan. 14, 2020

(65) Prior Publication Data

US 2021/0215775 A1  Jul. 15, 2021

(51) Int. Cl.
*G01R 33/07* (2006.01)
*G01R 33/00* (2006.01)

(52) U.S. Cl.
CPC ....... *G01R 33/072* (2013.01); *G01R 33/0017* (2013.01); *G01R 33/0029* (2013.01)

(58) Field of Classification Search
CPC .. G01D 5/244; G01D 5/2204; G01D 5/24409; G01D 5/24414; G01D 5/24419; G01D 5/24423; G01D 5/24428; G01D 5/24452; G01D 5/24476; G01D 5/2448; G01D 5/245; G01D 5/2451; G01D 5/2452; G01D 5/2454; G01D 5/2457; G01D 5/2458; G01D 5/142; G01D 5/145; G01D 5/147; G01D 5/16; G01D 5/165; G01D 5/24471; G01R 33/07; G01R 33/072; G01R 33/075; G01R 33/077; G01R 33/09; G01R 33/091; G01R 33/093; G01R 33/095; G01R 33/096; G01R 33/098; G01R 33/0023; G01R 33/0029; G01R 33/0035; G01R 33/0041; G01B 7/14; G01B 7/30
See application file for complete search history.

(56) References Cited

U.S. PATENT DOCUMENTS

| 4,371,837 | A | * | 2/1983 | Sieverin | ................ G01R 33/07 324/225 |
|---|---|---|---|---|---|
| 5,337,013 | A | * | 8/1994 | Langer | ................ G01R 31/006 324/537 |
| 5,694,038 | A | | 12/1997 | Moody et al. | |
| 6,100,680 | A | | 8/2000 | Vig et al. | |
| 6,232,768 | B1 | | 6/2001 | Moody et al. | |
| 6,404,088 | B1 | * | 6/2002 | Barada | ................ F16C 32/0446 310/68 R |
| 6,498,479 | B1 | * | 12/2002 | Hamaoka | ................ G01B 7/30 324/174 |

(Continued)

*Primary Examiner* — Patrick Assouad
*Assistant Examiner* — Demetrius R Pretlow
(74) *Attorney, Agent, or Firm* — Daly, Crowley, Mofford & Durkee, LLP

(57) ABSTRACT

A magnetic field sensor includes at least one magnetic field sensing element configured to generate a magnetic field signal indicative of a magnetic field associated with a target, an analog-to-digital converter configured to convert the magnetic field signal into a digital magnetic field signal, and a controller responsive to the digital magnetic field signal and configured to adjust an offset of the digital magnetic field signal during a first operational phase and to increase a gain of the digital magnetic field signal during a second operational phase following the first operational phase. The first and second operational phases occur during a running mode of sensor operation.

34 Claims, 4 Drawing Sheets

(56) References Cited

U.S. PATENT DOCUMENTS

| | | | |
|---|---|---|---|
| 6,556,153 B1* | 4/2003 | Cardamone | G01D 5/24404 341/111 |
| 7,046,000 B1* | 5/2006 | Hara | G01D 5/147 324/207.25 |
| 7,138,793 B1* | 11/2006 | Bailey | G01D 5/14 324/207.12 |
| 7,362,094 B2* | 4/2008 | Voisine | G01P 3/487 324/207.13 |
| 7,714,570 B2* | 5/2010 | Thomas | G01D 5/145 324/207.2 |
| 8,299,783 B2* | 10/2012 | Fernandez | G01D 5/2448 324/207.25 |
| 8,335,659 B2* | 12/2012 | Hernandez-Oliver | G01D 5/145 702/150 |
| 8,350,563 B2* | 1/2013 | Haas | G01R 33/02 324/225 |
| 8,723,512 B1* | 5/2014 | Burdette | G01P 3/489 324/207.25 |
| 8,729,892 B2* | 5/2014 | Friedrich | G01R 33/0005 324/247 |
| 2002/0149340 A1* | 10/2002 | Collier-Hallman | G01D 5/2033 318/727 |
| 2003/0117208 A1* | 6/2003 | Bicking | H03F 3/45475 327/513 |
| 2005/0127903 A1* | 6/2005 | Sogge | G01D 3/08 324/207.2 |
| 2005/0225319 A1* | 10/2005 | Bailey | G01R 33/025 324/207.12 |
| 2005/0275399 A1* | 12/2005 | Kitanaka | G01D 5/2449 324/207.12 |
| 2005/0278137 A1* | 12/2005 | Hammerschmidt | G01D 5/24452 702/151 |
| 2006/0208729 A1* | 9/2006 | Forrest | G01D 5/2451 324/207.26 |
| 2009/0009164 A1* | 1/2009 | Utsuno | G01R 33/07 324/251 |
| 2009/0033315 A1* | 2/2009 | Kawashima | G01D 5/145 324/207.2 |
| 2010/0188074 A1* | 7/2010 | Matsumoto | G01D 5/145 324/207.2 |
| 2011/0119015 A1* | 5/2011 | Hirobe | G01C 17/28 702/104 |
| 2011/0279072 A1* | 11/2011 | Shimizu | H02P 6/16 318/400.04 |
| 2011/0298447 A1* | 12/2011 | Foletto | G01R 25/005 324/207.2 |
| 2011/0298448 A1* | 12/2011 | Foletto | G01D 5/145 324/207.13 |
| 2011/0298449 A1* | 12/2011 | Foletto | G01B 7/00 324/207.13 |
| 2012/0223704 A1* | 9/2012 | Hayashi | G01D 5/147 324/244 |
| 2013/0015843 A1* | 1/2013 | Doogue | G01R 15/148 324/202 |
| 2013/0093412 A1* | 4/2013 | Anelli | G01R 33/0017 324/202 |
| 2013/0155562 A1* | 6/2013 | Kubota | G01D 5/24428 361/91.5 |
| 2013/0320970 A1* | 12/2013 | Foletto | G01D 5/2448 324/251 |
| 2013/0335074 A1* | 12/2013 | Dwyer | G01R 33/07 324/227 |
| 2014/0358320 A1* | 12/2014 | Hammerschmidt | G07C 5/00 701/1 |
| 2015/0061656 A1* | 3/2015 | Fernandez | G01D 5/2448 324/207.25 |
| 2015/0260803 A1* | 9/2015 | Chen | G01D 5/2448 324/251 |
| 2016/0208763 A1* | 7/2016 | Fernandez | G01P 13/00 |
| 2016/0377663 A1* | 12/2016 | Towne | G01R 31/28 324/764.01 |
| 2017/0356761 A1* | 12/2017 | Vig | G01D 5/147 |
| 2018/0052208 A1* | 2/2018 | Onaka | G01R 33/09 |
| 2018/0259594 A1* | 9/2018 | Fernandez | G01R 33/02 |
| 2018/0351484 A1* | 12/2018 | Mizuo | H02P 6/16 |
| 2019/0186385 A1* | 6/2019 | Shimane | F02D 9/00 |
| 2019/0257639 A1* | 8/2019 | Tomida | G01R 15/205 |
| 2020/0217639 A1* | 7/2020 | Kura | G01R 33/0035 |
| 2020/0249051 A1* | 8/2020 | Einspieler | G01D 5/2449 |

* cited by examiner

MAGNETIC FIELD SENSOR OFFSET AND GAIN ADJUSTMENT

CROSS-REFERENCE TO RELATED APPLICATIONS

Not Applicable.

STATEMENT REGARDING FEDERALLY SPONSORED RESEARCH

Not Applicable.

FIELD

This invention relates generally to magnetic field sensors and, more particularly, to magnetic field sensors implementing offset and gain adjustment.

BACKGROUND

As is known, magnetic field sensors are used in a variety of applications and generally include one or more magnetic field sensing elements, such as Hall effect elements or magnetoresistance elements, which provide a signal (i.e., a magnetic field signal) proportional to a detected magnetic field. One example application is in motion (e.g., rotation) detectors where a magnetic field sensor is used to detect motion of an object, such as a ferromagnetic object, for example, a gear or ring magnet. Common sensors include an analog-to-digital converter (ADC) to convert the magnetic field signal into a digital signal for further processing. Some motion detectors generate an output signal indicative of the speed of motion of the object. Other motion detectors generate an output signal indicative of a direction of motion of the object as well.

Sensor accuracy can be adversely affected by many factors, including DC offset of the magnetic field signals and a peak-to-peak value of the magnetic field signals being relatively small. For example, in applications where a sensor is used to detect the rotation of a target (e.g., crank, cam, transmission, wheel speed, etc.), performance can depend directly on the amplitude of the signal that is being processed.

Conventional sensors use offset adjustment methodologies to center the magnetic field signals within the ADC's voltage range, or rails, since working close to the rails of an ADC can expose the sensor to non-linearity and saturation. Therefore, an offset adjustment is used to bring the signal in the middle range of the ADC.

Furthermore, sensors often implement gain adjustment schemes to increase the signal gain to a level that is as large as possible without causing clipping. The smaller the input signal, the smaller it will be after the ADC and so a low signal to noise ratio can adversely affect the accuracy of the processed digital signal. Therefore, it is preferred to use the full range of the ADC for the signal conversion. Conventional gain adjustment schemes provide a maximum gain and then reduce the gain until the peak-to-peak signal value is within the ADC range.

Typically, offset and gain adjustment is implemented during a start-up phase of operation, when the sensor is not able to provide an accurate output signal, thereby adversely extending the start-up phase. For example, the start-up phase can be defined as the time needed for the sensor to accurately track the peaks of the magnetic field signal in order to set the switching threshold at the correct level and provide accurate direction information in the sensor output signal. Various conditions can be used to end the start-up phase and begin a running mode phase of operation when the sensor output signal is considered accurate. For example, the start-up phase may end after a predetermined time interval or a predetermined number of magnetic periods have occurred.

SUMMARY

According to the disclosure, a magnetic field sensor includes at least one magnetic field sensing element configured to generate a magnetic field signal indicative of a magnetic field associated with a target, an analog-to-digital converter configured to convert the magnetic field signal into a digital magnetic field signal, and a controller responsive to the digital magnetic field signal and configured to adjust an offset of the digital magnetic field signal during a first operational phase and to increase a gain of the digital magnetic field signal during a second operational phase following the first operational phase.

Features may include one or more of the following individually or in combination with other features. During a running mode of operation of the sensor, the controller is further configured to generate an output signal of the sensor based on a comparison of the digital magnetic field signal to a threshold value, wherein the output signal comprises transitions occurring at switch points having a predetermined relationship with respect the digital magnetic field signal crossing the threshold value. The output signal of the sensor is indicative of one or both of a speed of motion of the target and a direction of motion of the target. The first and second operational phases occur during the running mode.

With this arrangement, offset and gain adjustment are performed after the start-up phase of operation in order to avoid any undesirable delay during the start-up operational phase. By beginning gain adjustment after the start-up phase and with a minimum gain value, the length and accuracy of the start-up phase of operation is improved as compared to traditional methods where the gain adjustment is performed during start-up beginning with a maximum value that is subsequently reduced.

The controller is configured to adjust the gain and the offset of the digital magnetic field signal during the second operational phase. The controller can be configured to adjust the offset of the digital magnetic field signal and the gain of the digital magnetic field signal once per magnetic period of the target. The controller can be configured to adjust the offset of the digital magnetic field signal and the gain of the digital magnetic field signal after the switch points. In some embodiments, switch points correspond to one of a rising transition slope of the magnetic field signal or the falling slope of the magnetic field signal and wherein the offset of the digital magnetic field signal is adjusted on the other one of the rising slope of the magnetic field signal or the falling slope of the magnetic field signal. The first operational phase can end when the digital magnetic field signal is substantially centered within a predetermined range of codes associated with the ADC. The second operational phase can end when a peak-to-peak value of the digital magnetic field signal reaches a predetermined value. The sensor can include a memory, wherein a final value of an offset adjustment and a final value of a gain adjustment are stored in the memory. Upon a subsequent power up of the magnetic field sensor following storage of the final value of the offset adjustment and the final value of the gain adjustment, the controller can be configured to use the stored final value of the offset adjustment and the final value of the gain adjustment as initial adjustment values. During the running mode, the controller can be configured to periodically verify that the final value of the offset adjustment and the final value of the gain adjustment are within a predetermined tolerance.

Also described is a method including generating a magnetic field signal with one or more magnetic field sensing elements, the magnetic field signal indicative of a magnetic field associated with a target, converting the magnetic field signal into a digital magnetic field signal, generating, during a running mode of operation, a sensor output signal comprising transitions occurring at switch points having a predetermined relationship with respect to the magnetic field signal crossing a threshold level, adjusting an offset of the digital magnetic field signal during a first operational phase of the running mode, and adjusting a gain of the digital magnetic field signal during a second operational phase of the running mode following the first operational phase.

Features may include one or more of the following individually or in combination with other features. Generating the sensor output signal can include indicating a speed of motion of the target and a direction of motion of the target. Adjusting the offset of the digital magnetic field signal can occur during the second operational phase. Adjusting the gain of the digital magnetic field signal can include increasing the gain of the digital magnetic field signal. The offset of the digital magnetic field signal and the gain of the digital magnetic field signal can be adjusted approximately once per magnetic period of the target. The offset of the digital magnetic field signal and the gain of the digital magnetic field signal can be adjusted after the switch points. The first operational phase can end when the digital magnetic field signal is substantially centered within a predetermined range of codes associated with converting the magnetic field signal into a digital magnetic field signal. The second operational phase can end when a peak-to-peak value of the digital magnetic field signal reaches a predetermined value.

According to a further aspect, a magnetic field sensor includes at least one magnetic field sensing element configured to generate a magnetic field signal indicative of a magnetic field associated with a target, an analog-to-digital converter configured to convert the magnetic field signal into a digital magnetic field signal, and means for adjusting an offset of the digital magnetic field signal during a first operational phase and increasing a gain of the digital magnetic field signal during a second operational phase following the first operational phase. The first and second operational phases can occur during a running mode of operation of the sensor during which a sensor output signal is provided, wherein the sensor output signal is indicative of one or both of a speed of motion of the target or a direction of motion of the target.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
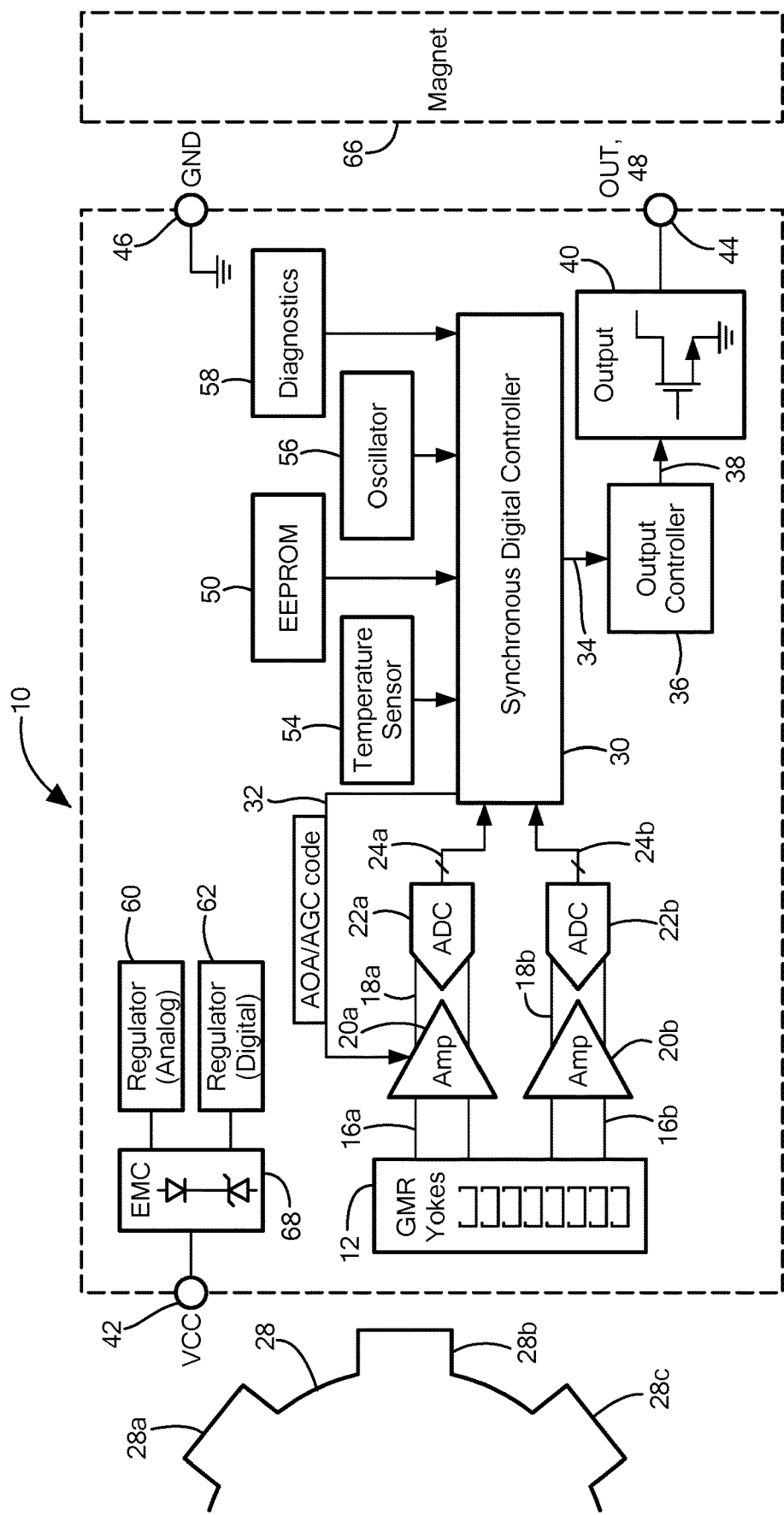
FIG. 1 is a block diagram of a magnetic field sensor implementing offset and gain adjustment according to the disclosure.

Before describing the present invention, some introductory concepts and terminology are explained. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector. A rotation detector can sense rotation of an object, for example, advance and retreat of magnetic domains of a ring magnet or advance and retreat of gear teeth of a ferromagnetic gear. The term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. The circuits and techniques described herein apply to any magnetic field sensor capable of detecting a magnetic field.

As used herein, the terms "processor" and "controller" are used to describe elements that perform a function, an operation, or a sequence of operations. The function, operation, or sequence of operations can be hard coded into an electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory, in a discrete electronic circuit which can be analog or digital, and/or in special purpose logic circuitry (e.g., a field programmable gate array (FPGA)). Processing can be implemented in hardware, software, or a combination of the two. Processing can be implemented using computer programs executed on programmable computers/machines that include one or more processors, a storage medium or other article of manufacture that is readable by the processor (including volatile and non-volatile memory and/or storage elements), at least one input device and one or more output devices. Program code can be applied to data entered using an input device to perform processing and to generate output information. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Referring to FIG. 1, a magnetic field sensor 10 includes at least one magnetic field sensing element 12 configured to generate a magnetic field signal, and here two differential magnetic field signals 16a, 16b, indicative of a magnetic field associated with a target 28. Sensing elements 12 can take a variety of forms, such as the illustrated GMR yokes as may be arranged in one or more bridge or other configurations in order to generate one or more single-ended or differential signals indicative of the sensed magnetic field. Each of the magnetic field signals 16a, 16b is coupled to a respective processing channel as can include an amplifier (i.e., front end amplifier) 20a, 20b and an analog-to-digital converter (ADC) 22a, 22b, respectively. Output signals 18a, 18b of the amplifiers 20a, 20b can be gain and/or offset adjusted as will be explained. The ADCs 22a, 22b may take various forms and may include one or more filters, such as a low pass filter and/or notch filter, and as may take the form of a sigma delta modulator to generate respective digital magnetic field signals 24a, 24b.

Digital magnetic field signals 24a, 24b can be coupled to a digital controller 30 for processing. Digital controller 30 processes the digital magnetic field signals 24a, 24b to determine the speed, position, and/or direction of movement, such as rotation of target 28 and outputs one or more digital signals 34 to output controller 36 as will be described. Suffice it to say here that the controller 30 is configured to generate an output signal 48 of the sensor based on a comparison of the digital magnetic field signals to a threshold value, such that the output signal includes transitions occurring at switch points having a predetermined relationship with respect the digital magnetic field signal crossing the threshold value.

When the sensor 10 is powered up, it enters a "start-up" phase of operation during which the controller 30 acquires positive and negative peaks of the digital magnetic field signals 24a, 24b. The start-up phase is provided in order to permit the controller to accurately track the signal peaks and this initial operational phase can end based on various conditions depending on the application. For example, the start-up phase can end once the target has completed a predetermined number of revolutions or after a predetermined number of magnetic periods have occurred. Whether the controller output signal 34 or sensor output signal 48 is provided during the start-up phase is application dependent. For example, depending on the application, the output signal can be provided during the start-up phase, the output signal can be provided but with only speed information rather than also direction information during the start-up phase, or the output signal can be blocked, or blanked during the start-up phase since its transitions may not be accurate.

Following the start-up phase, the sensor 10 enters a "running mode" phase of operation. During the running mode, the controller output signal 34 can be considered accurate as the magnetic field signal peaks have been acquired during the start-up phase.

According to the disclosure, controller 30 is responsive to the digital magnetic field signal 24a, 24b and configured to adjust an offset of the digital magnetic field signal during a first operational phase and to increase a gain of the digital magnetic field signal during a second operational phase following the first operational phase. The first and second operational phases occur during the running mode operation of the sensor.

With this arrangement, offset and gain adjustment are performed gradually after the start-up phase of operation and during the running mode in order to avoid undesirable delay during the start-up phase and reduce the time it takes for the sensor 10 to provide an accurate output signal 48. By beginning offset and gain adjustment after the start-up phase and with an increasing gain, the length and accuracy of the start-up phase of operation is improved as compared to traditional methods where the gain adjustment is performed during start-up beginning with a maximum value that is subsequently is reduced.

More particularly, controller 30 is configured to determine offset and gain adjustments, which adjustments can be applied to the magnetic field signals in various ways. In the illustrated embodiment, an offset code (automatic offset adjustment, or AOA code) and a gain code (automatic gain adjustment, or AGC code), here labelled collectively as code 32, can be applied to the magnetic field signals 16a, 16b by the front-end amplifiers 20a, 20b in order to generate offset and/or gain adjusted signals 18a, 18b. In some embodiments, one or more look-up tables can be stored and can include a plurality of codes 32 and corresponding signal offset and gain adjustments. The offset and gain adjustments thus determined from the look-up table can be applied using a resistor network with which resistor ratios can be adjusted to adjust the applied offset and/or gain for example.

Controller 30 determines the speed, position, and/or direction of target 28 based on the magnetic field signals 24a, 24b and can combine this information with fault or other diagnostic information in some embodiments to generate the sensor output signal 48 in various formats. Output controller 36 encodes the information provided by controller output 34 (e.g., speed and/or direction information) to provide an output signal 38 for coupling to an output driver 40, which output driver 40 generates the sensor output signal 48 at an output terminal 44.

Output driver 40 can provide the sensor output signal 48 in various formats, such as a so-called two-wire format in which the output signal is provided in the form of current pulses on the power connection to the sensor (i.e., on a VCC connection at terminal 42) or a three-wire format in which the output signal is provided at a separate dedicated output connection (i.e., on an OUT connection at terminal 44). Formats of the output signal 48 can include a variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit (I²C) format, or other similar signal formats.

The digital controller 30 is configured to function as a detector to generate the sensor output signal 48 based on a comparison of the digital magnetic field signal 24a, 24b to a threshold value. More particularly, the controller output signal 34 includes transitions occurring at switch points having a predetermined relationship with respect the digital magnetic field signal crossing the threshold value. The controller output signal 34 can be a binary, two-state signal that has transitions or can be pulses occurring at the switch points for example. Movement speed of the target 28 can be detected in accordance with the frequency of the binary signal or pulses as applicable.

Various schemes are possible for generating the threshold value and more than one threshold value can be used to provide hysteresis for example. In some embodiments, the controller 30 tracks positive and negative peaks of the digital magnetic field signals 24a, 24b and generates the threshold value as a percentage of the difference between the positive and negative peaks (i.e., as a percentage of the peak-to-peak magnetic field signals). Other threshold values are also possible.

A direction of rotation of the target 28 can be determined in embodiments containing multiple sensing elements 12 and respective processing channels as shown, which processing channels are configured to generate phase separated magnetic field signals 24a, 24b (as are sometimes referred to as channel signals). The direction of rotation can be determined based on a relative phase or relative time difference (e.g., lag or lead) of a particular edge transition of detector output signals associated with the phase separated magnetic field signals 24a, 24b.

Additional elements of the sensor 10 can include a memory device, as may take the form of an EEPROM 50, a temperature sensor 54, an oscillator 56, and a diagnostics circuit 58. Additional terminals of the sensor can include a power terminal 42 coupled to an EMC protection circuit 68 and a ground terminal 46. A regulator 60 can provide power to analog circuitry of the sensor and a regulator 62 can provide power to digital circuitry of the sensor.

Memory 50 can be used to store values for various sensor functionality, including but not limited to storing gain and offset adjustment values according to an aspect of the disclosure as will be explained.

Target 28 can have a variety of forms, including, but not limited to a gear having gear teeth 28a-28c or a ring magnet having one or more pole pairs. Also, linear arrangements of ferromagnetic objects that move linearly are possible. In the example embedment of FIG. 1, magnetic field sensor 10 may take the form of a rotation detector to detect passing gear teeth, for example, gear teeth 28a-28c of a ferromagnetic gear or, more generally target object 28. A permanent magnet 66 can be placed proximate to the gear 28, resulting in fluctuations of a magnetic field proximate to the gear as the gear rotates so as to form a so-called "back-bias" arrangement. Features of the target 28 are spaced from the sensing elements 12 by an airgap.

Figure 1A:
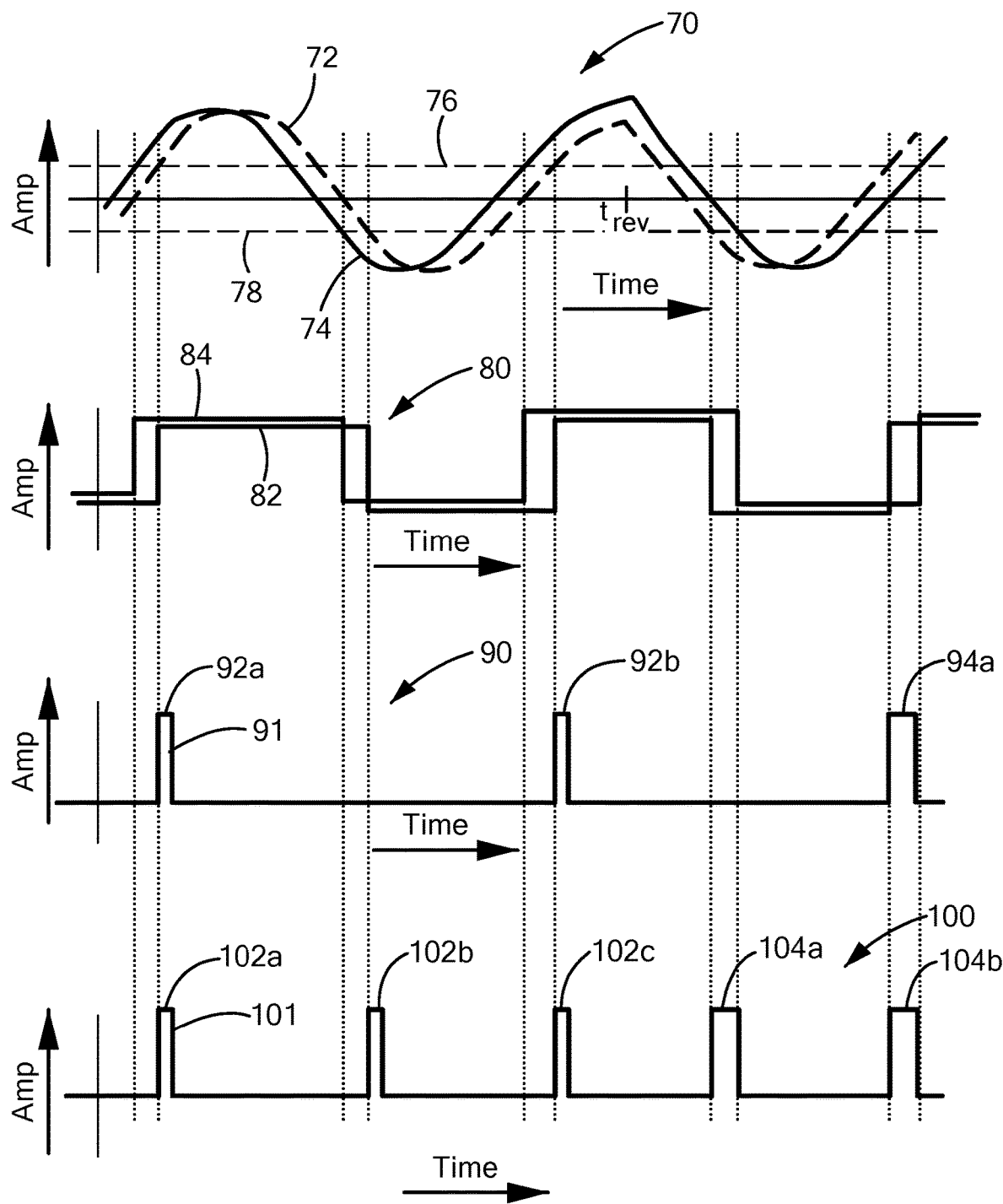
FIG. 1A shows several waveforms associated with the magnetic field sensor of FIG. 1.

Referring also to FIG. 1A, graphs 70, 80, 90, 100 have the same horizontal axes with scales in arbitrary units of time and vertical axes with scales in arbitrary units of amplitude. In the graph 70, signals 72, 74 are representative of signals 16a, 16b or 18a, 18b of FIG. 1. Threshold 76 is indicative, for example, of sixty percent of a peak-to-peak value of either one of the signals 72, 74, and threshold 78 is indicative, for example, of forty percent of a peak-to-peak value of either one of the signals 72, 74. While two thresholds 76, 78 are shown, it will be appreciated that more than two thresholds or less than two thresholds can be used. Signals 72, 74 illustrate a change of rotation direction of the target 28 at a time trey. Before the time trey, the signal 74 leads the signal 72 in phase and after the time trey, the signal 72 leads the signal 74 in phase.

In the graph 80, signals 82, 84 have transitions when the signals 72, 74 cross thresholds 76, 78, respectively. Before the time trey, the signal 84 leads the signal 82 in phase and after the time trey, the signal 82 leads the signal 84 in phase. Thus, a relative phase of the two signals 82, 84, can be used, for example, by the digital controller 30 or by the output controller 36 of FIG. 1, to determine the direction of rotation of the target 28.

In the graph 90, a signal 91 can include pulses 92a, 92b, and 94a that occur proximate to a time of positive or negative transitions of one of the signals 82, 84 (i.e., that occur at switch points) and that can be representative of output pulses generated by controller 30. For example pulses 92a, 92b, 94a here occur proximate to a time of positive transitions of signal 82. Thus, the pulses 92a, 92b, 94a occur once during each full cycle (i.e., during each magnetic period) of the respective signal 72, 74. Here, a magnetic period can correspond to the period of the magnetic field signals (e.g., signals 16a, 16b, 18a, 18b, or 72, 74) which, in turn, can correspond to the period between successive target mechanical features such as tooth edges in the case of a gear target with teeth or edges of magnetic domains of the same polarity in the case of a ring magnet target, for example.

A rate of the pulses 92a, 92b, and 94a can be indicative of a speed of rotation of the target 28. Durations, e.g., respective pulse widths, of the pulses 92a, 92b, and 94a can be indicative of a direction of rotation of the target 28. For example, before the time trey, the pulses 92a, 92b can be shorter, e.g., forty-five microseconds, and after the time trey, the pulses 94a can be longer, e.g., ninety microseconds.

In the graph 100, a signal 101 can include pulses 102a, 102b, 102c, 104a, and 104b that can occur proximate to a time of both positive and negative transitions of one of the signals 82a, 84b. Thus, the pulses 102a, 102b, 102c, 104a, and 104b occur at each half cycle of the respective signal 72, 74. Here again, a rate of the pulses 102a, 102b, 102c, 104a, and 104b can be indicative of the speed of rotation of the target 28 and a duration, or pulse width of the pulses 102a, 102b, 102c, 104a, and 104b can be indicative of a direction of rotation of the target 28. It should be apparent that a rate of the pulses 102a, 102b, 102c, 104a, 104b is twice the rate of the pulses 92a, 92b, 94a.

Whether controller 30 generates speed pulses like pulses 92a, 92b, 94b that occur on each cycle of the signals 72, 74 or speed pulses like pulses 102a, 102b, 102c, 104a, 104b that occur on each half-cycle of the signals 72, 74 is application dependent.

Figure 2:
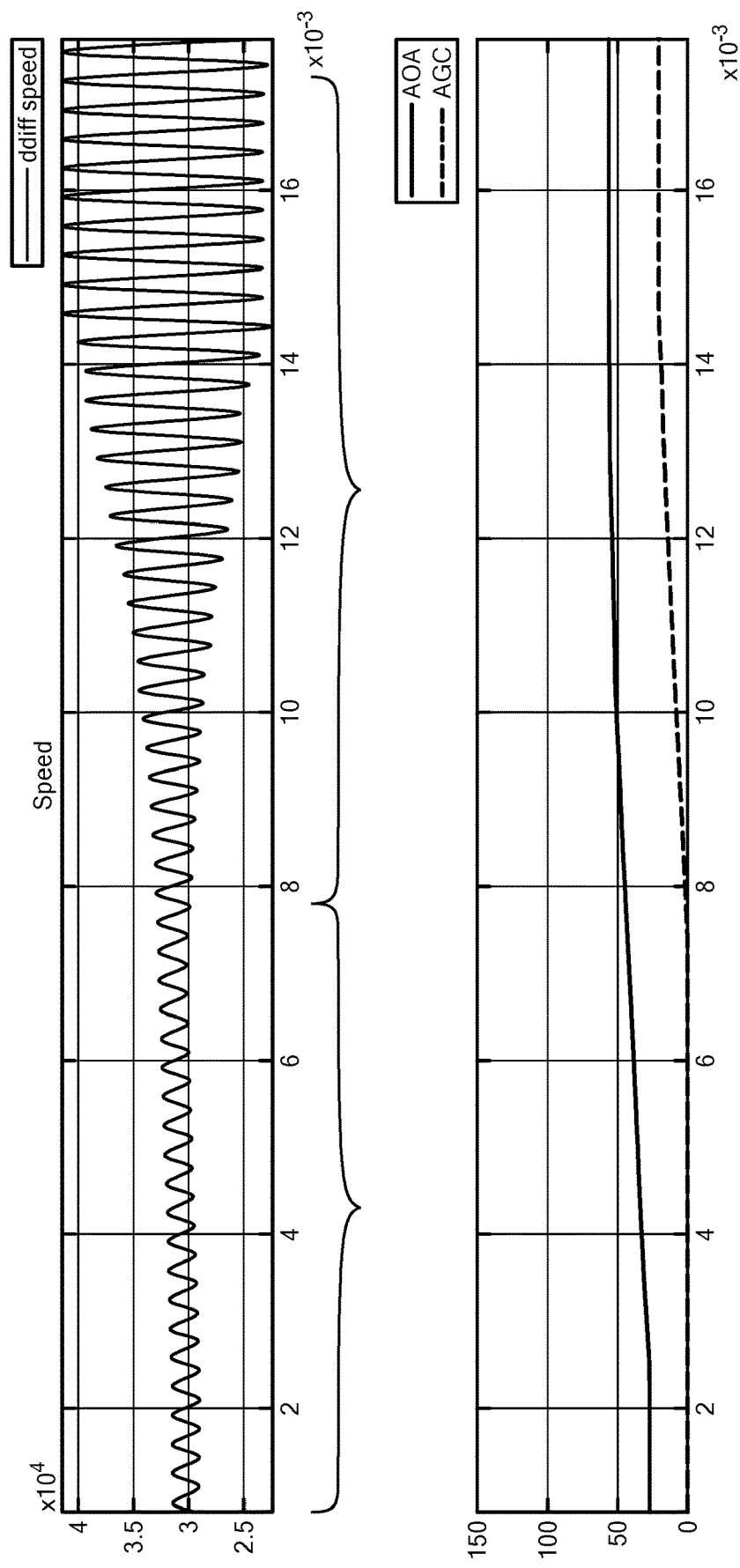
FIG. 2 shows an example magnetic field signal undergoing offset and gain adjustment according to the disclosure and a graph illustrating the offset and gain adjustment as a function of ADC codes.

Referring also to FIG. 2, a magnetic field signal 200, as may be an offset and/or gain adjusted signal 18a, 18b (FIG. 1), is shown. The horizontal axis represents arbitrary units of time and the vertical axis represents arbitrary units of steps of the ADCs 22a, 22b, referred to herein as codes. The ADCs 22a, 22b may have a range of 25,000 codes centered at a code of 32,000 for example.

In operation, once power is applied to the sensor 10, the start-up phase begins (not shown in FIG. 2) and in an example embodiment ends at a time t0, once three magnetic periods have occurred. However, as noted above, various conditions can trigger the end of the start-up phase and the beginning of the running mode.

At time t0 in FIG. 2, the running mode is entered. Notably, during the running mode, the controller 30 has already tracked the peaks of the magnetic field signal and so the output signal 48 provides accurate speed and direction information even while the gain and offset adjustment is occurring. This is because the sensor output 48 is based on a normalized signal and changing the offset and/or the amplitude of the signal do not affect a normalized signal.

The magnetic field signal 200 has a peak-to-peak signal level indicative the strength of the sensed magnetic field, which signal level will be larger in smaller airgap installations and smaller in larger airgap installations. The illustrated peak-to-peak signal level at time t0 is equivalent to approximately 2000 ADC codes and the magnetic field signal 200 is centered at an ADC code of approximately 30,000. However, in the example embodiment, the center of the ADC code range is code 32,000.

During a first operational phase (labelled phase 1) of the running mode beginning at time t0, the offset of the magnetic field signal 200 is adjusted. Offset adjustment can be accomplished by the controller 30 computing the current center point of the signal 200 and comparing the computed current center point to the center of the ADC code range. The current signal center point can be computed by acquiring a positive peak of the digital magnetic field signal (e.g., signal 24a or 24b), acquiring a negative peak of the digital magnetic field signal, determining one-half of the difference between the positive and negative peaks, and adding that difference value to the negative peak of the digital magnetic field signal (or subtracting that difference value from the positive peak of the digital magnetic field signal). In the example signal 200, the positive peak of the signal 200 is at code 31,000 and the negative peak is at code 29,000. One half of the difference is thus 1000 which can be added to the negative peak value of 29,000 to arrive at the signal center point of 30,000. The controller 30 compares the computed center point to the center of the ADC range (e.g., 32,000 in the example embodiment) and generates an offset adjustment code (e.g., code 32 of FIG. 1) in order to move the magnetic field signal 200 up or down according to whether the signal is currently centered at a voltage below or above the center of the ADC range, respectively. Once the signal 200 is determined to be centered in the ADC range as desired (i.e., at approximately 32,000 codes in this example), the current offset adjustment code can provide a final, or updated offset adjustment code that can be stored as will be described. The first operational phase can end when the signal 200 is determined to be centered within the ADC voltage range.

A second phase of operation, labelled phase 2, can follow the first phase starting at a time t1 and can include gain adjustment. Gain adjustment can be accomplished by applying a minimum gain (i.e., a minimum gain code 32) and subsequently increasing the applied gain until the peak-to-peak value of signal 200 is determined to have a predetermined value.

The predetermined value for the peak-to-peak signal 200 can be tailored to a particular application and can be preset or programmable. By way of a nonlimiting example, the second phase of operation can end when the peak-to-peak level of signal 200 is determined to be approximately equal to the input code range of the ADCs 22a, 22b (i.e., the predetermined value can be the input code range of the ADCs). Alternatively, the predetermined value can be a percentage of the ADC code range. For example, the predetermined value can be 60% of the ADC code range. In this case, in the example in which the ADC has a range of 25,000 codes, the desired predetermined peak-to-peak signal value of signal 200 can be at approximately 60% of the full range of codes or 15,000 codes.

If the peak-to-peak value of signal 200 has not reached the predetermined value, the controller 30 can generate a gain adjustment code (e.g., code 32 of FIG. 1) in order to increase the gain of the 200. Once the peak-to-peak value of signal 200 reaches the predetermined value, the current gain adjustment code can provide a final, or updated gain adjustment code that can be stored as will be described.

In embodiments, the second operational phase can include additional offset adjustment. Further offset adjustment during the second phase can be desirable since the signal 200 may not be perfectly centered during phase 1, for example due to the resolution of the ADCs. More particularly, the center of the ADC is a fixed number, for example exactly 32000 codes. When we adjust the offset from the front end, it is not done with a precision of 1 code. This means that there is always a predefined tolerance that is used to consider the signal centered (even though it is not 100% centered). In an example, the predefined value is 500 code, meaning that the signal is considered centered as long as its offset is between 31500 and 32500 codes. Further, during the gain adjustment in the second operational phase, offset adjustment can occur in cases where the gain makes the signal go off the center of the rails. In other words, if the signal is perfectly centered, then increasing the gain would not affect the offset of the signal. However, if the signal is not perfectly centered during the first operational phase, there will be a difference between the ideal centered code 32000 and the offset of the signal after being considered centered. If you increase the gain, you also increase by the same factor this difference on offset between the ideal offset and real offset. If this difference becomes higher than the tolerance (e.g., 500 codes) then offset would require further adjustment.

The second operational phase ends when the digital magnetic field signal is determined to have the predetermined peak-to-peak value and to be centered. The length of time (e.g., the number of magnetic periods) required to complete the first and second operational phases depends on how much adjustment needs to be made for the sensor to arrive at the final values for the gain and the offset.

It will be appreciated that because offset and gain adjustment occurs during the running mode, the digital magnetic field signal is not fully optimized (i.e., is not fully centered or gain adjusted) until the second phase of operation ends. As a result, even though the magnetic field signal is being tracked correctly and the correct direction information is being generated, due to the fact that adjustments are being made to the signal, the accuracy of the output 48 might be slightly affected. However, measurements of jitter or other performance parameters typically are done over thousands of target revolutions, so this small initial inaccuracy is generally negligible.

According to the disclosure, one or both of the final offset adjustment code and the final gain adjustment code can be stored in memory 50 (e.g., self-written into EEPROM) for future use. For example, when the sensor 10 is next powered on, the previously stored final codes can be read from memory and used to apply initial offset and/or gain adjustments to the magnetic field signal in order to thereby power on directly with the correctly trimmed gain and offset values. With this arrangement, the length of the first and second phases of operation during this subsequent power up of the sensor can be shorter than otherwise necessary in order to center the signal and provide the desired peak-to-peak signal level since the initial codes have already been trimmed in the environment of the sensor installation. In this way, the disadvantage of having offset and gain adjustments introduce delay in generating an accurate sensor output signal can be minimized or even eliminated.

Following the second operational phase, the running mode of operation of the sensor continues and the offset and/or gain of the magnetic field signal can be monitored periodically, such as once per magnetic period, and adjusted as necessary even after the second operational phase ends. For example, controller 30 can periodically verify that the signal amplitude and offset are accurate to within a predetermined tolerance and if not, additional adjustments can be made in order to get the signal back to the desired location and/or peak-to-peak range. The predetermined tolerances can be tailored (e.g., preset or programmable) to suit a particular application.

Also shown in FIG. 2 is a graph 210 illustrating example AOA and AGC codes (e.g., code 32 in FIG. 1) with a horizontal axis in the same arbitrary units of time as signal 200 and a vertical axis with a scale in arbitrary units of offset and gain adjustment codes.

According to the disclosure, the signal offset and gain are adjusted gradually, such as once per magnetic period. Further, the signal offset and gain are adjusted after the switch points. With these features, the offset and/or gain adjustments do not interfere with, or otherwise disturb the speed pulses (e.g., pulses 92a, 92b, 94a).

For example, where the switch points occur on one of a rising slope of the magnetic field signal or the falling slope of the magnetic field signal, the offset of the digital magnetic field signal can be adjusted on the other one of the rising slope of the magnetic field signal or the falling slope of the magnetic field signal. For example, referring to FIG. 1A, switch points corresponding to pulses 92a, 92b, 94a occur on the rising slope of magnetic field signal 72. In this example, the offset can be adjusted at times corresponding to falling slope of the magnetic field signal 72. The gain adjustments can occur relatively soon after the switch points.

Figure 3:
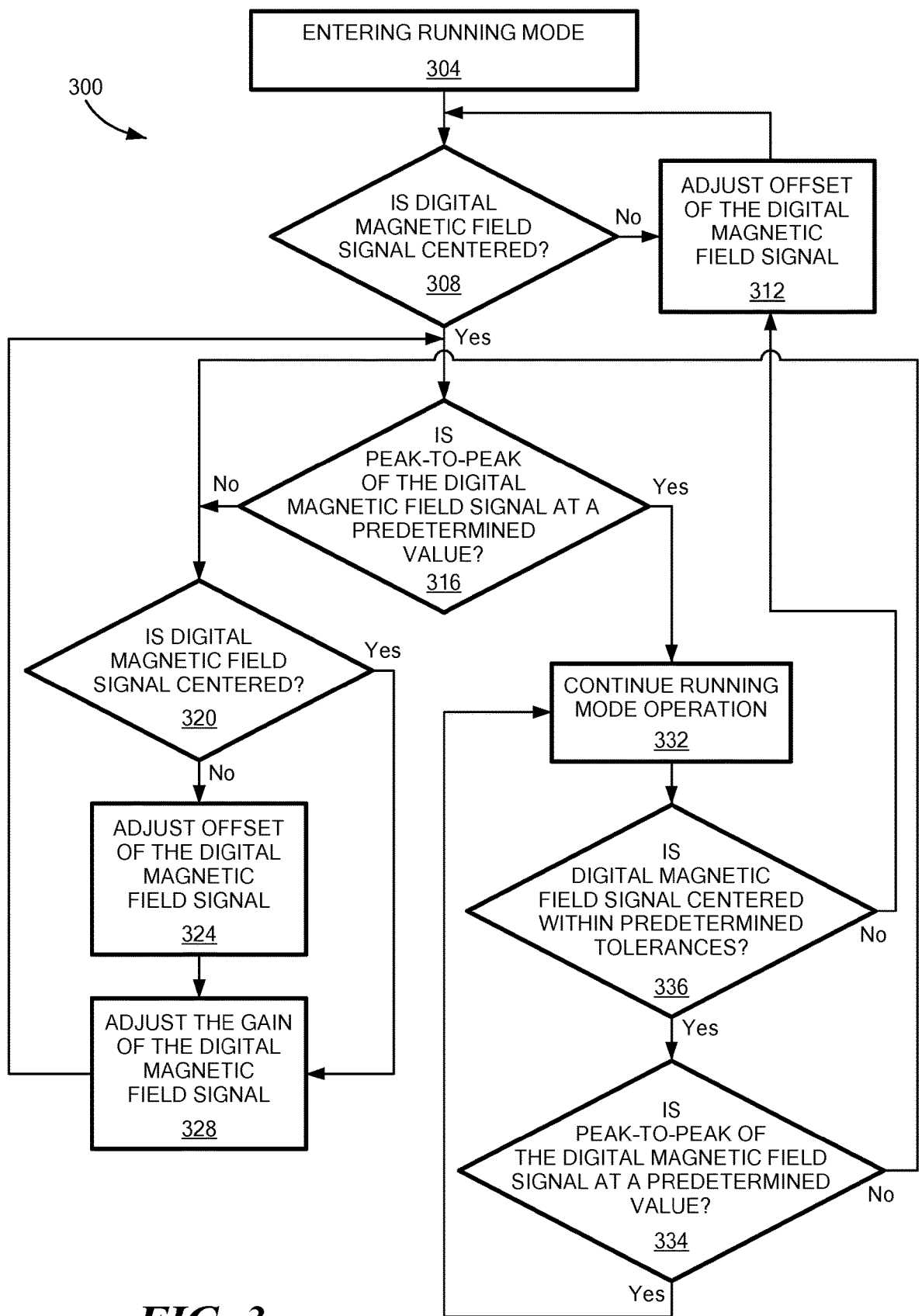
FIG. 3 is a flow diagram illustrating offset and gain adjustment of the magnetic field sensor of FIG. 1 according to the disclosure.

Referring also to FIG. 3, a flow diagram illustrates offset and gain adjustment 300 according to the disclosure. The process begins at block 304 when the running mode of operation begins (following a start-up mode). At block 308, it is determined by controller 30 whether the digital magnetic field signal is centered within a desired range. For example and as explained above, the desired range may correspond to the input range of the ADCs 22a, 22b.

If the signal is not centered, then the offset is adjusted at block 312. Offset adjustment may be accomplished as explained above. The combination of blocks 308 and 312 represents the first phase of operation in the running mode and is repeated until the signal is determined to be centered, following which the process progresses to the second phase of operation at block 316.

At block 316, it is determined whether the peak-to-peak value of the digital magnetic field signal is at a predetermined value as explained above. If the digital magnetic field signal is not at the predetermined peak-to-peak value, then it is again determined whether the digital magnetic field signal is centered within a desired range at block 320. If the signal is not centered, then offset adjustment is applied at block 324; whereas, if the signal is centered, then the gain is adjusted at block 328. Gain adjustment can be accomplished as explained above, by beginning with application of a small or minimum gain. Blocks 316, 320, 324, and 328 are repeated until the signal is determined to be both centered and at the predetermined peak-to-peak signal value, following which the process progresses to block 332 at which time the second operational phase ends and running mode continues, as shown.

In embodiments, the offset and/or gain are periodically monitored during the running mode after the second phase of operation ends as illustrated by blocks 336 and 340. In particular, at block 336 it is determined whether the digital magnetic field signal is still centered within a desired range to within a predetermined tolerance. If the signal is not centered within the predetermined tolerance, then the process returns to block 312. In some embodiments, blocks 336, 340 are occur once per period of the magnetic field signal.

If the digital magnetic field signal is determined at block 336 to be centered, then it is determined at block 334 whether the peak-to-peak value of the digital magnetic field signal is at a predetermined value. If the signal peak-to-peak value is not at the predetermined value, then the process returns to block 320; whereas, if the signal peak-to-peak value is at the predetermined value, then running mode continues at block 332, as shown.

A final gain adjustment code can be stored at block 328 and a final offset adjustment code can be stored any time a new offset adjustment code is determined, such as in blocks 312 and 324. By this storage, the advantage of providing an accurate sensor output signal more quickly following subsequent powering on of the sensor can be achieved.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A magnetic field sensor comprising:
   at least one magnetic field sensing element configured to generate a magnetic field signal indicative of a magnetic field associated with a target;
   an analog-to-digital converter configured to convert the magnetic field signal into a digital magnetic field signal; and
   a controller responsive to the digital magnetic field signal and configured to adjust an offset of the digital magnetic field signal during a first operational phase and to increase a gain of the digital magnetic field signal during a second operational phase following the first operational phase, wherein, during a running mode of operation of the sensor, the controller is further configured to generate an output signal of the sensor based on a comparison of the digital magnetic field signal to a threshold value, wherein the output signal comprises transitions occurring at switch points having a predetermined relationship with respect the digital magnetic field signal crossing the threshold value.

2. The magnetic field sensor of claim 1 wherein the output signal of the sensor is indicative of one or both of a speed of motion of the target and a direction of motion of the target.

3. The magnetic field sensor of claim 1 wherein the first and second operational phases occur during the running mode.

4. The magnetic field sensor of claim 1 wherein the controller is configured to adjust the gain and the offset of the digital magnetic field signal during the second operational phase.

5. The magnetic field sensor of claim 1 wherein the controller is configured to adjust the offset of the digital magnetic field signal and the gain of the digital magnetic field signal once per magnetic period of the target.

6. The magnetic field sensor of claim 1 wherein the controller is configured to adjust the offset of the digital magnetic field signal and the gain of the digital magnetic field signal after the switch points.

7. The magnetic field sensor of claim 6 wherein the switch points correspond to one of a rising slope of the magnetic field signal or a falling slope of the magnetic field signal and wherein the offset of the digital magnetic field signal is adjusted on the other one of the rising slope of the magnetic field signal or the falling slope of the magnetic field signal.

8. The magnetic field sensor of claim 1 wherein the first operational phase ends when the digital magnetic field signal is centered within a predetermined range of codes associated with the analog-to-digital converter.

9. The magnetic field sensor of claim 1 wherein the second operational phase ends when a peak-to-peak value of the digital magnetic field signal reaches a predetermined value.

10. The magnetic field sensor of claim 1 further comprising a memory, wherein a final value of an offset adjustment and a final value of a gain adjustment are stored in the memory.

11. The magnetic field sensor of claim 10 wherein upon a subsequent power up of the magnetic field sensor following storage of the final value of the offset adjustment and the final value of the gain adjustment, the controller is configured to use the stored final value of the offset adjustment and the final value of the gain adjustment as initial adjustment values.

12. The magnetic field sensor of claim 10 wherein, during the running mode, the controller is configured to periodically verify that the final value of the offset adjustment and the final value of the gain adjustment are within a predetermined tolerance.

13. A method comprising:
   generating a magnetic field signal with one or more magnetic field sensing elements, the magnetic field signal indicative of a magnetic field associated with a target;
   converting the magnetic field signal into a digital magnetic field signal;
   generating, during a running mode of operation, a sensor output signal comprising transitions occurring at switch points having a predetermined relationship with respect to the magnetic field signal crossing a threshold level;
   adjusting an offset of the digital magnetic field signal during a first operational phase of the running mode; and
   adjusting a gain of the digital magnetic field signal during a second operational phase of the running mode following the first operational phase.

14. The method of claim 13 wherein generating the sensor output signal comprises indicating a speed of motion of the target and a direction of motion of the target.

15. The method of claim 13 further comprising adjusting the offset of the digital magnetic field signal during the second operational phase.

16. The method of claim 13 wherein adjusting the gain of the digital magnetic field signal comprises increasing the gain of the digital magnetic field signal.

17. The method of claim 13 wherein the offset of the digital magnetic field signal and the gain of the digital magnetic field signal are adjusted approximately once per magnetic period of the target.

18. The method of claim 13 wherein the offset of the digital magnetic field signal and the gain of the digital magnetic field signal are adjusted after the switch points.

19. The method of claim 13 wherein the first operational phase ends when the digital magnetic field signal is centered within a predetermined range of codes associated with converting the magnetic field signal into a digital magnetic field signal.

20. The method of claim 13 wherein the second operational phase ends when a peak-to-peak value of the digital magnetic field signal reaches a predetermined value.

21. A magnetic field sensor comprising:
- at least one magnetic field sensing element configured to generate a magnetic field signal indicative of a magnetic field associated with a target;
- an analog-to-digital converter configured to convert the magnetic field signal into a digital magnetic field signal; and
- means for adjusting an offset of the digital magnetic field signal during a first operational phase and increasing a gain of the digital magnetic field signal during a second operational phase following the first operational phase, wherein, during a running mode of operation of the sensor, the adjusting means is further configured to generate an output signal of the sensor based on a comparison of the digital magnetic field signal to a threshold value, wherein the output signal comprises transitions occurring at switch points having a predetermined relationship with respect the digital magnetic field signal crossing the threshold value.

22. The magnetic field sensor of claim 21 wherein the first and second operational phases occur during a running mode of operation of the sensor during which a sensor output signal is provided, wherein the sensor output signal is indicative of one or both of a speed of motion of the target or a direction of motion of the target.

23. A magnetic field sensor comprising:
- at least one magnetic field sensing element configured to generate a magnetic field signal indicative of a magnetic field associated with a target;
- an analog-to-digital converter configured to convert the magnetic field signal into a digital magnetic field signal; and
- a controller responsive to the digital magnetic field signal and configured to adjust an offset of the digital magnetic field signal during a first operational phase and to increase a gain of the digital magnetic field signal during a second operational phase following the first operational phase, wherein the first operational phase ends when the digital magnetic field signal is centered within a predetermined range of codes associated with the analog-to-digital converter.

24. The magnetic field sensor of claim 23 wherein, during a running mode of operation of the sensor, the controller is further configured to generate an output signal of the sensor based on a comparison of the digital magnetic field signal to a threshold value, wherein the output signal comprises transitions occurring at switch points having a predetermined relationship with respect the digital magnetic field signal crossing the threshold value.

25. The magnetic field sensor of claim 24 wherein the output signal of the sensor is indicative of one or both of a speed of motion of the target and a direction of motion of the target.

26. The magnetic field sensor of claim 24 wherein the first and second operational phases occur during the running mode.

27. The magnetic field sensor of claim 23 wherein the controller is configured to adjust the gain and the offset of the digital magnetic field signal during the second operational phase.

28. The magnetic field sensor of claim 23 wherein the second operational phase ends when a peak-to-peak value of the digital magnetic field signal reaches a predetermined value.

29. A magnetic field sensor comprising:
- at least one magnetic field sensing element configured to generate a magnetic field signal indicative of a magnetic field associated with a target;
- an analog-to-digital converter configured to convert the magnetic field signal into a digital magnetic field signal; and
- a controller responsive to the digital magnetic field signal and configured to adjust an offset of the digital magnetic field signal during a first operational phase and to increase a gain of the digital magnetic field signal during a second operational phase following the first operational phase, wherein the second operational phase ends when a peak-to-peak value of the digital magnetic field signal reaches a predetermined value.

30. The magnetic field sensor of claim 29 wherein, during a running mode of operation of the sensor, the controller is further configured to generate an output signal of the sensor based on a comparison of the digital magnetic field signal to a threshold value, wherein the output signal comprises transitions occurring at switch points having a predetermined relationship with respect the digital magnetic field signal crossing the threshold value.

31. The magnetic field sensor of claim 30 wherein the output signal of the sensor is indicative of one or both of a speed of motion of the target and a direction of motion of the target.

32. The magnetic field sensor of claim 30 wherein the first and second operational phases occur during the running mode.

33. The magnetic field sensor of claim 29 wherein the controller is configured to adjust the gain and the offset of the digital magnetic field signal during the second operational phase.

34. The magnetic field sensor of claim 29 wherein the first operational phase ends when the digital magnetic field signal is centered within a predetermined range of codes associated with the analog-to-digital converter.

* * * * *

UNITED STATES PATENT AND TRADEMARK OFFICE
CERTIFICATE OF CORRECTION

PATENT NO. : 11,125,837 B2
APPLICATION NO. : 16/742314
DATED : September 21, 2021
INVENTOR(S) : Florian Kulla It is certified that error appears in the above-identified patent and that said Letters Patent is hereby corrected as shown below:

In the Specification

Column 2, Line 28 delete "respect the" and replace with --respect to the--.

Column 6, Line 38 delete "respect the" and replace with --respect to the--.

Column 6, Line 64 delete "signal" and replace with --signals--.

Column 7, Line 14 delete "subsequently is reduced" and replace with --subsequently reduced--.

Column 7, Line 56 delete "signal" and replace with --signals--.

Column 7, Line 59 delete "respect the" and replace with --respect to the--.

Column 8, Line 34 delete "embedment" and replace with --embodiment--.

Column 8, Line 38 delete "gear 28," and replace with --target 28,--.

Column 8, Line 55 delete "trey. Before the time trey," and replace with --$t_{rev}$. Before the time $t_{rev}$,--.

Column 8, Line 56 delete "trey," and replace with --$t_{rev}$,--.

Column 8, Line 60 delete "trey," and replace with --$t_{rev}$,--.

Column 8, Line 61 delete "trey," and replace with --$t_{rev}$,--.

Column 9, Line 7 delete "signal" and replace with --signals--.

Column 9, Line 19 delete "trey," and replace with --$t_{rev}$,--.

Signed and Sealed this
Twenty-fifth Day of October, 2022

*Katherine Kelly Vidal*

Katherine Kelly Vidal
*Director of the United States Patent and Trademark Office*

CERTIFICATE OF CORRECTION (continued)
U.S. Pat. No. 11,125,837 B2

Column 9, Line 20 delete "trey," and replace with --$t_{rev}$,--.

Column 9, Line 27 delete "signal" and replace with --signals--.

Column 9, Line 60 delete "do not" and replace with --does not--.

Column 9, Line 62 delete "indicative the" and replace with --indicative to the--.

Column 10, Line 59 delete "the 200." and replace with --the signal 200.--.

Column 12, Line 25 delete "to falling" and replace with --to the falling--.

Column 12, Line 67 delete "are occur" and replace with --occur--.

In the Claims

Column 13, Line 49 delete "respect the" and replace with --respect to the--.

Column 15, Line 24 delete "respect the" and replace with --respect to the--.

Column 15, Line 54 delete "respect the" and replace with --respect to the--.

Column 16, Line 37 delete "respect the" and replace with --respect to the--.